(12) United States Patent
Lin

(10) Patent No.: US 7,666,029 B2
(45) Date of Patent: Feb. 23, 2010

(54) BURN-IN SOCKET

(75) Inventor: Chun-Fu Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/384,600

(22) Filed: Apr. 7, 2009

(65) Prior Publication Data

US 2009/0253276 A1    Oct. 8, 2009

(30) Foreign Application Priority Data

Apr. 7, 2008    (TW)    ............................... 97205829 U

(51) Int. Cl.
*H05K 1/00*    (2006.01)

(52) U.S. Cl. ........................................ 439/526; 439/73

(58) Field of Classification Search ................ 439/526, 439/73, 70–72, 525, 331
See application file for complete search history.

(56) References Cited

U.S. PATENT DOCUMENTS

| 5,730,620 | A | * | 3/1998 | Chan et al. .................. 439/526 |
| 5,865,639 | A | * | 2/1999 | Fuchigami et al. .......... 439/330 |
| 7,410,363 | B1 | * | 8/2008 | Gattuso et al. ................ 439/71 |

* cited by examiner

*Primary Examiner*—Gary F. Paumen
(74) *Attorney, Agent, or Firm*—Andrew C. Cheng; Wei Te Chung; Ming Chieh Chang

(57) ABSTRACT

A burn-in socket for testing an integral circuit package includes a base defining a cavity, an adapter received in the cavity of the base, an alignment plate secured to the adapter, and a cover movable mounted to the base. The alignment plate is detachable assembled to the adapter so as to the burn-in socket can apply to different IC package when the alignment plate is replaced with another.

16 Claims, 5 Drawing Sheets

BURN-IN SOCKET

FIELD OF THE INVENTION

The present invention relates to a burn-in socket, and more particularly to a burn-in socket with an aligning plate removeably attached to an adapter for facilitating readily testing of a chipset to be tested therein.

DESCRIPTION OF THE PRIOR ART

Electronic packages, such as integrated circuits (ICs), are miniaturized electronic devices, in which a number of active and passive circuit elements are located on or within a continuous body of material to perform the function of a complete circuit. To ensure reliability in use, the ICs require prior burning-in to test their durability as well as performance. The ICs are run at high temperature for an extended period of time to accelerate invalidation of ICs with disfigurements. This helps elimination of early product failures once the ICs are sold and/or assembled onto electronic end devices. A burn-in socket assembly is used to receive an IC therein, and electrically connects the IC with a burn-in board for operation of the IC at high temperature.

A conventional burn-in socket comprises a base, a adapter received in the base, a cover moveable relative to the base, and a heat sink mounted to the cover, The adapter defines a space for receiving the IC package. Generally, the burn-in socket needs different adapters when the dimension of the IC is changed. It is need a new adapter for a burn-in socket applying to different IC package. Each chipset carries a tailored adaptor in light of its unique form factor and/or dimensions. However, the adapter attached to the base has a complicated configuration. To provide a new adapter makes the manufacture difficult and increasing the cost of the burn-in socket.

Therefore, there is need to supply an improved burn-in socket.

SUMMARY OF THE INVENTION

Accordingly, an object of the present invention is to provide a burn-in socket which has an adapter engaging with detachable alignment plates capable of receiving different IC packages therein.

In order to achieve the object set forth, a burn-in socket for testing an integral circuit (IC) package comprises a base defining a cavity, an adapter received in the cavity of the base, an alignment plate, and a cover movable mounted to the base from an open to a closed position with hooks engaging with the base at the closed position. The adapter defines a first opening and has a supporting face for confronting the IC package. The alignment plate is received in the first opening of the adapter and engaging with latches of the adapter. The alignment plate defines a second opening extending therethrough for positioning the IC package.

DESCRIPTION OF PREFERRED EMBODIMENT

Reference will now be made to the drawings to describe the present invention in detail.

Figure 1:
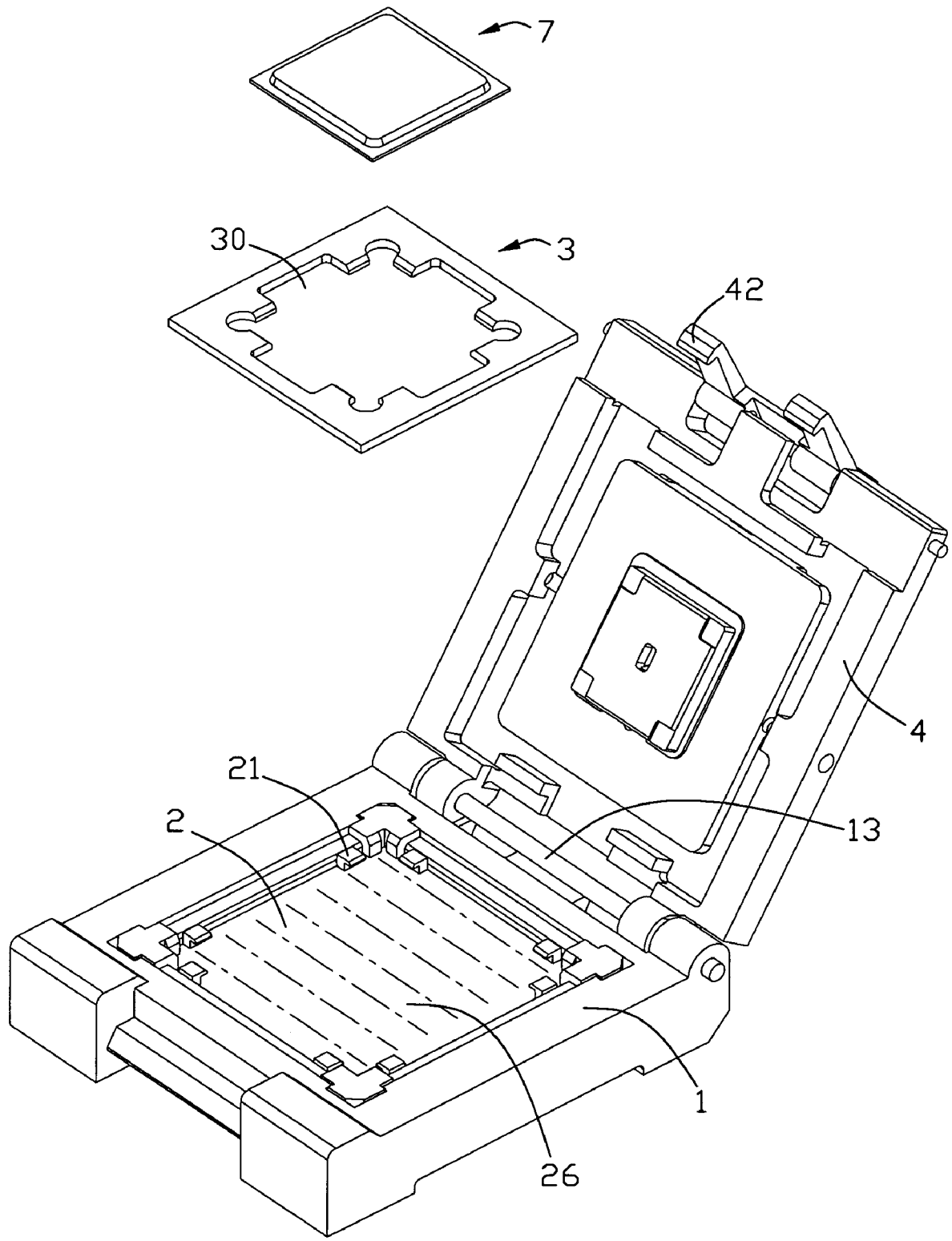
FIG. 1 is an exploded view of a burn-in socket according to a preferred embodiment of the present invention, showing the IC package and the alignment plate detached from the socket.
Figure 2:
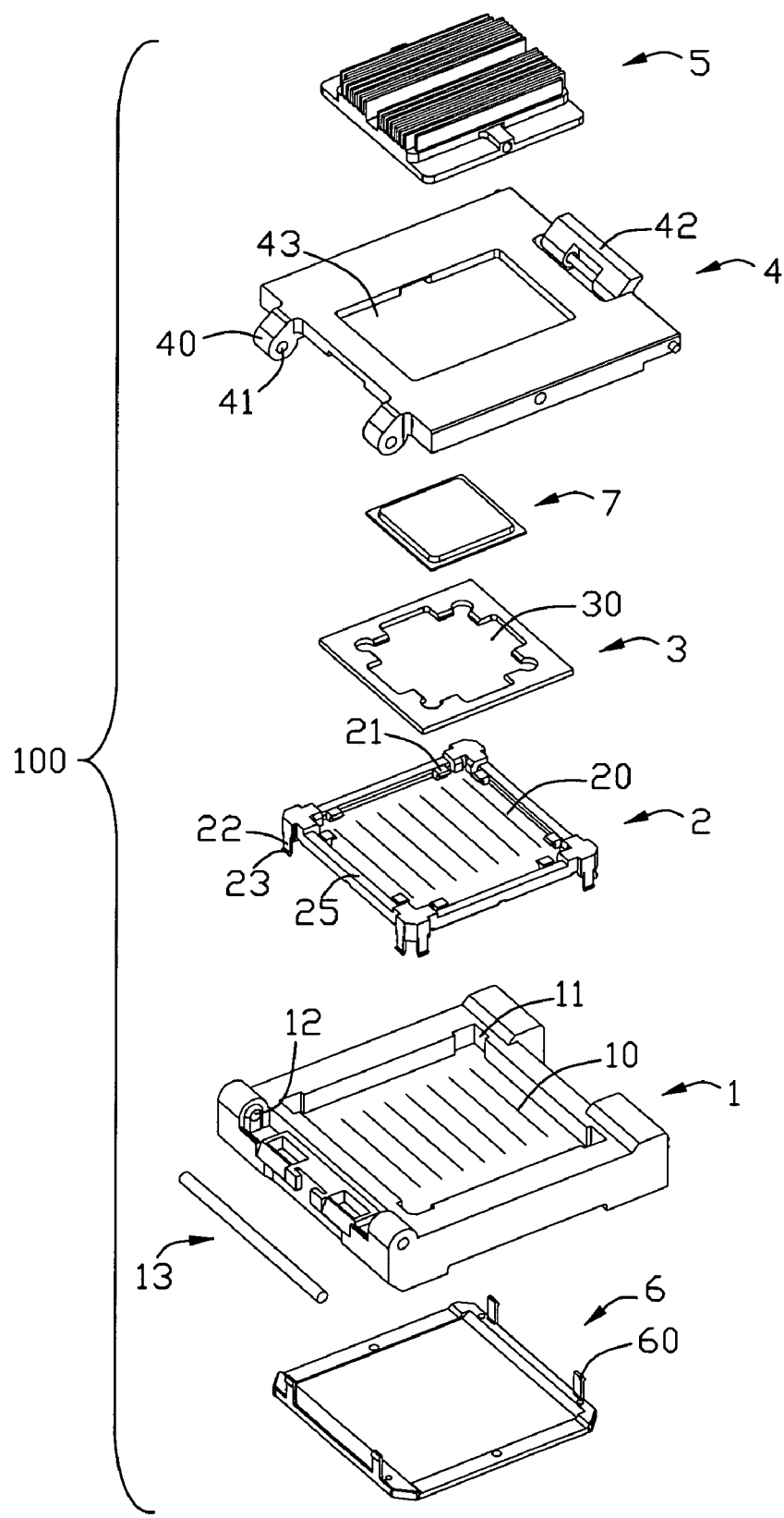
FIG. 2 is another exploded view of the burn-in socket shown in FIG. 1.

Please referring to FIGS. 1-2, a burn-in socket 100 for testing an integral circuit (IC) package 7 comprises a base 1 with a cavity 10, an adapter 2 received in the cavity 10, an alignment plate 3 engaging with the adapter 2, a cover 4 rotatably assembled to the base 1, a heat sink 5 secured to the cover 4, and a bottom plate 6 positioned to the base 1 at a bottom end thereof.

The base 1 has a rectangular configuration and defines a plurality of notches 11 communicating with the cavity 10. A pair of holes 12 is formed at one end of the base 1. The cover 4 is attached to the base 1 with a pair of projections 40. Each projecting 40 defines a through hole 41 for a shaft 13 extending therethrough and further received in the holes 12 of the base 1 so that the cover 4 rotates relative to the base 1 from an opened position to a closed position. The cover 4 defines an opening 43 for receiving the heat sink 5 and has a pair of hooks 42 opposite to the projections to secure the IC package 7 at the closed position. The heat sink 5 is located proximately to the IC package 7 at the closed position.

Figure 3:
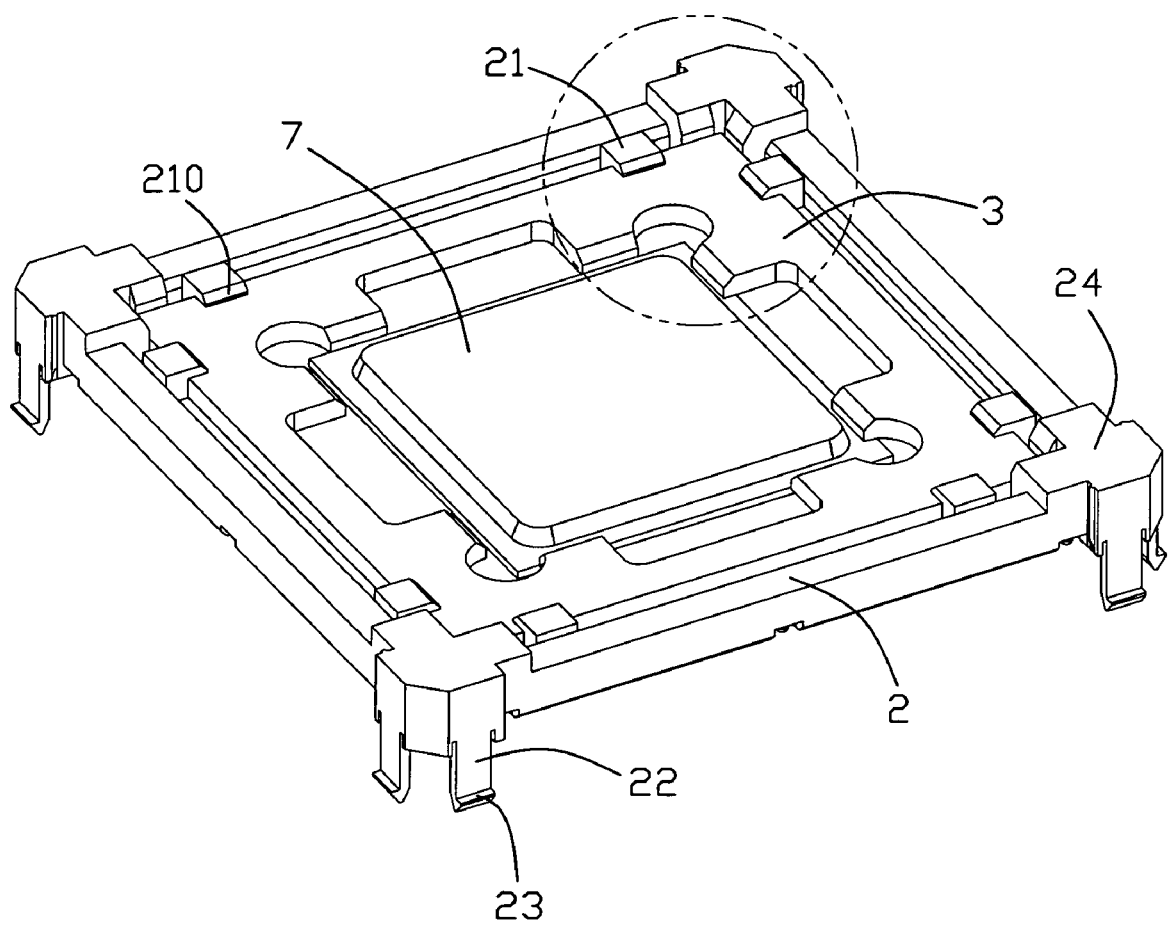
FIG. 3 is an assemble view of the IC package, the alignment plate and the adapter shown in FIG. 1.
Figure 4:
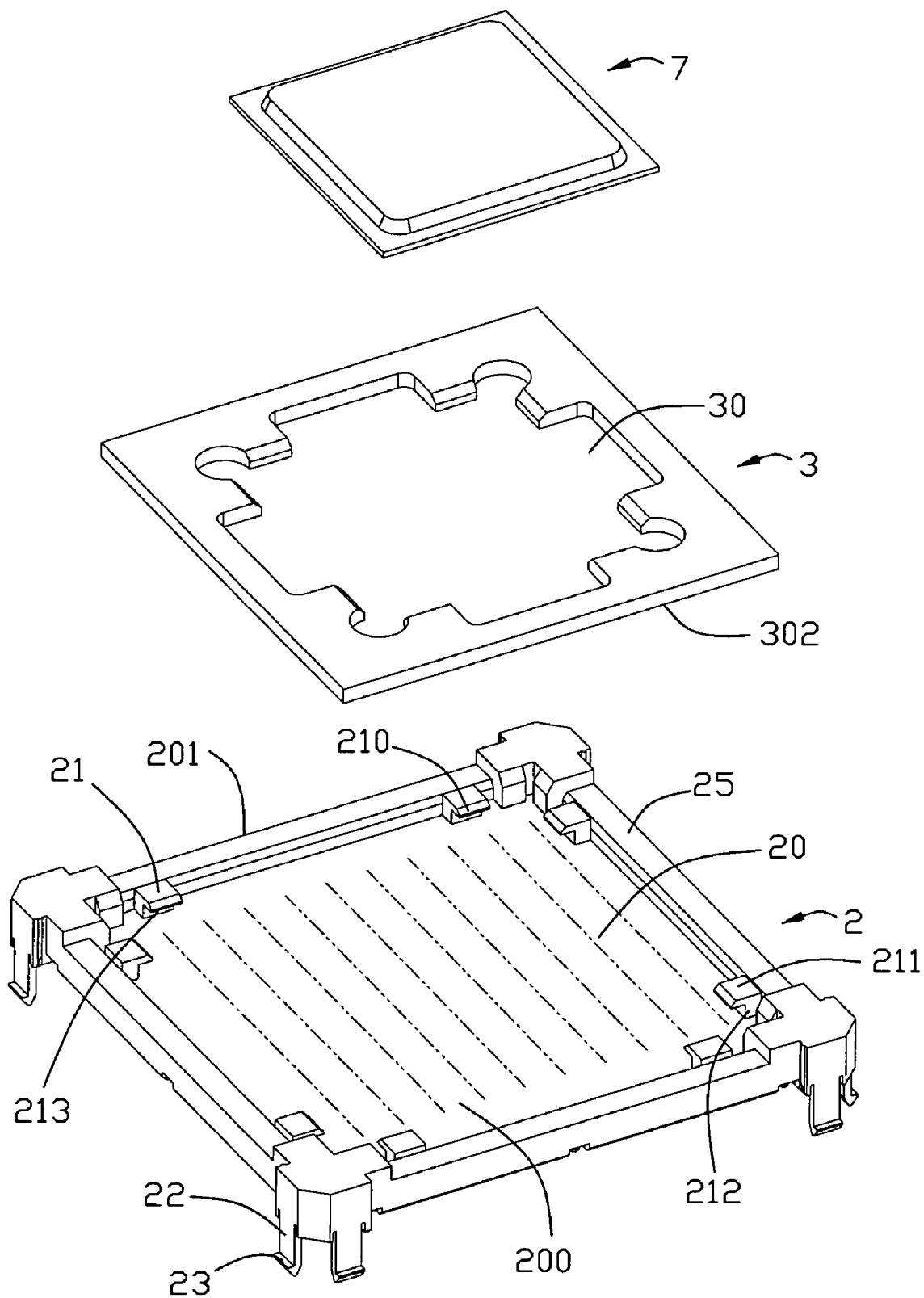
FIG. 4 is an exploded view of FIG. 3.
Figure 5:
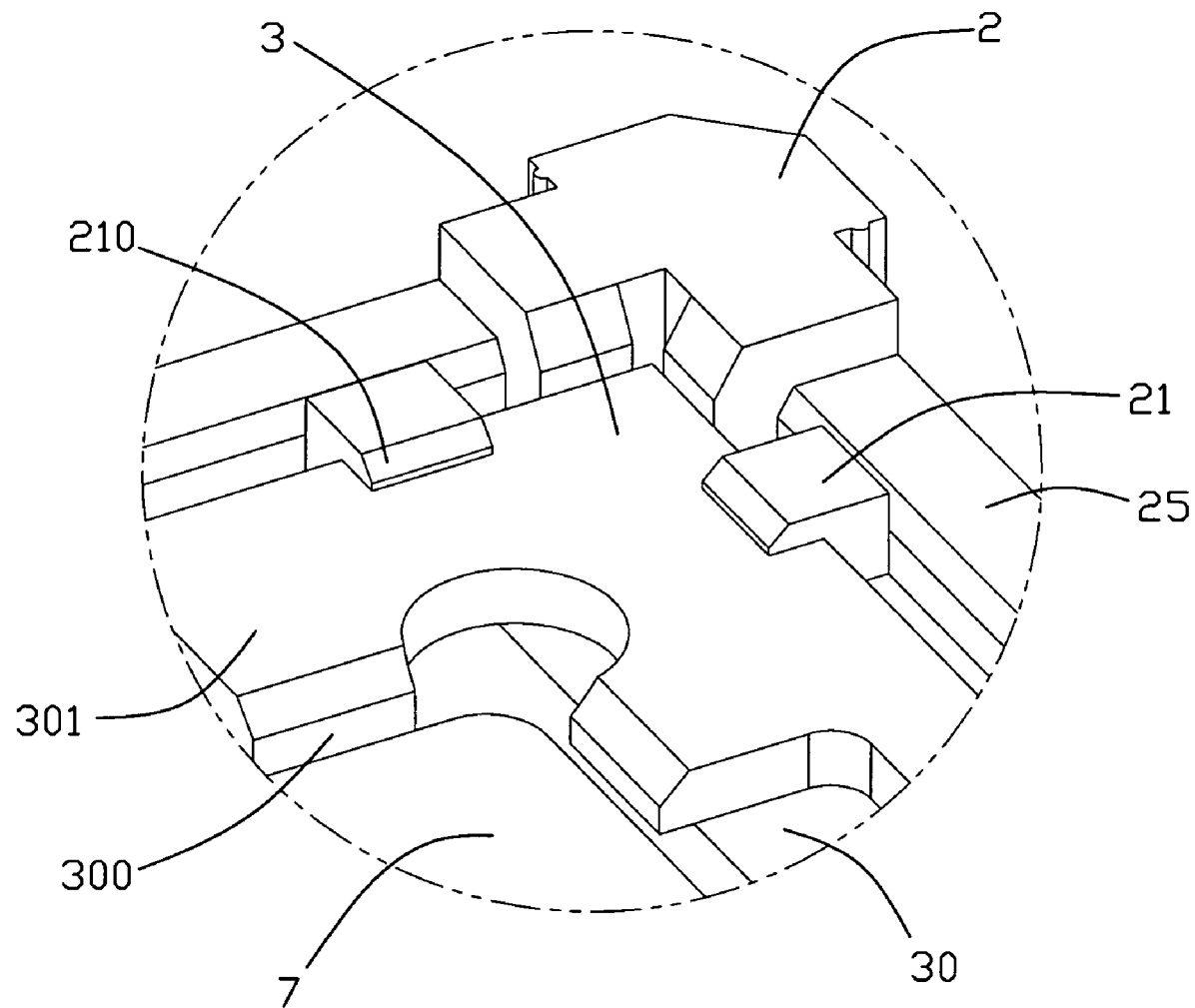
FIG. 5 is an enlarge view of the circle portion shown in FIG. 3.

Please referring to FIGS. 3-5, the adapter 2 comprises a supporting plate 20 and a plurality of arms 22 projecting downwardly from the supporting plate 20. Each arm 22 has a hook 23 at bottom end thereof for latching with the base 1 and an enlarge section 24 at a top end thereof and disposed in the notch 12 of the base 1. The supporting plate 20 is provided with a supporting face 200 abutting the IC package 7 and a plurality of side walls 25 extending upwardly from the supporting face 200. The side wall 25 and the supporting plate 20 jointly define a first opening 26 for receiving the alignment plate 3. The first opening 26 is located between a top face 201 of the side wall 25 and the supporting face 200.

The adapter 2 is further provides a plurality of latches 21 adjacent to the sidewalls 25. Each of the latches 21 includes a vertical section 212 extending upwardly from the supporting plate 20 and a horizontal section 211 bending inwardly from the vertical section 212 to position the alignment plate 3 in vertical and horizontal direction. The vertical and horizontal sections 211, 212 define a recess 213 to received edges of the alignment plate 3. A slant surface 210 is formed on the horizontal section 211 for guiding the alignment plate 3 to slide into the recess 213.

The flat alignment plate 3 has top and bottom surfaces 301, 302 opposite to each other and defines a second opening 30 extending therethrough. The second opening 30 of the alignment plate 3 is corresponding to the IC package 7 and side face 300 of the second opening 30 abutting against the IC package 7 for positioning the IC package. After assembly, the top face 301 of the alignment plate 3 is abutting against the horizontal section 211 and located under the top face of the adapter 2. The thickness of the alignment plate 3 is smaller than height of the first opening 26.

The alignment plate 3 is detachably assembled to the adapter 2 and can be taken off so that this alignment plate 3 is replaced by another alignment plate. The burn-in socket in accordance with the present invention can apply to different IC package for the second opening of the alignment plate provided with different dimension.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket for testing an integral circuit (IC) package comprising:
a base defining a cavity,
an adapter received in the cavity of the base and including a plurality of latches, the adapter defining a first opening and providing a supporting face for abutting the IC package;
an alignment plate received in the first opening of the adapter and engaging with the latches of the adapter, the alignment plate defining a second opening extending therethrough for positioning the IC package therein, and
a cover movable mounted to the base from an open to a closed position and having hooks engaging with the base at the closed position.

2. The burn-in socket as claimed in claim 1, wherein the adapter comprises a supporting plate and a plurality of arms projecting downwardly from the supporting plate for latching with the base.

3. The burn-in socket as claimed in claim 2, wherein the latch each includes a vertical section extending upwardly from the supporting plate and a horizontal section bending inwardly from the vertical section to position the alignment plate in vertical and horizontal direction.

4. The burn-in socket as claimed in claim 3, wherein the vertical and horizontal section of the latch define a recess and the horizontal section has a slant surface for guiding the alignment plate receiving in the recess.

5. The burn-in socket as claimed in claim 1, wherein the second opening of the alignment plate is corresponding to the IC package and side face of the second opening abutting against the IC package.

6. The burn-in socket as claimed in claim 1, wherein the alignment plate is detachable assembled on the adapter.

7. The burn-in socket as claimed in claim 1, wherein the cover is attached to the base by an axis at one end of the base so as to the cover rotate relative to the cover, and the hooks are at the other end of the base.

8. The burn-in socket as claimed in claim 1, further comprising a heat sink secured to the cover and contacting with the IC package at the closed position.

9. A burn-in socket for testing an integral circuit (IC) package comprising:
a base defining a cavity,
an adapter received in the cavity of the base, the adapter having a top face and a supporting face jointly defining a first opening;
an alignment plate detachable assembled to the adapter and received in the first opening of the adapter, the alignment plate defining a second opening extending therethrough for positioning the IC package, thickness of the alignment plate being smaller than height of the recess, and
a cover rotatably mounted to the base from an open to a closed position and having hooks engaging with the base at the closed position.

10. The burn-in socket as claimed in claim 9, wherein the adapter comprises a supporting plate and a plurality of arms projecting downwardly from the supporting plate for latching with the base.

11. The burn-in socket as claimed in claim 10, wherein the latch each includes a vertical section extending upwardly from the supporting plate and a horizontal section bending inwardly from the vertical section to position the alignment plate in vertical and horizontal direction.

12. The burn-in socket as claimed in claim 11, wherein the vertical and horizontal section of the latch define a recess and the horizontal section has a slant surface for guiding the alignment plate sliding into the recess, and wherein top face of the alignment plate is under the horizontal section of the latch.

13. The burn-in socket as claimed in claim 9, wherein the second opening of the alignment plate is corresponding to the IC package so that side face of the second opening abutting against the IC package.

14. The burn-in socket as claimed in claim 9, further comprising a heat sink secured to the cover for contacting with the IC package at the closed position and a bottom plate positioned to the base at a bottom end thereof.

15. A burn-in socket for testing an integral circuit (IC) package comprising:
a base defining a receiving cavity,
an adapter received in the receiving cavity and downwardly fastened to the base via first securing devices, the adapter defining a first opening and providing a supporting face for abutting the IC package;
an alignment plate received in the first opening and downwardly locked to the adapter via second securing devices, the alignment plate defining a second opening extending therethrough for positioning the IC package therein, and
a cover movable mounted to the base from an open to a closed position and having hooks engaging with the base at the closed position; wherein
both said first securing devices and said second securing devices are located on four corners of the receiving cavity.

16. The burn-in socket as claimed in claim 15, further including a bottom plate locked to the base via an upward assembling.

* * * * *